(12) United States Patent
Seshan et al.

(10) Patent No.: US 6,376,899 B1
(45) Date of Patent: Apr. 23, 2002

(54) PLANAR GUARD RING

(75) Inventors: Krishna Seshan, San Jose; Neal R. Mielke, Los Altos Hills, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/651,367

(22) Filed: Aug. 29, 2000

Related U.S. Application Data

(63) Continuation of application No. 09/001,397, filed on Dec. 31, 1997, now Pat. No. 6,137,155.
(51) Int. Cl.$^7$ .................................................. H01L 23/544
(52) U.S. Cl. ................................... 257/620; 257/637
(58) Field of Search ................................. 257/620–778

(56) References Cited

U.S. PATENT DOCUMENTS

| | | | |
|---|---|---|---|
| 4,841,354 A | * 6/1989 | Inaba | 257/620 |
| 5,270,256 A | 12/1993 | Bost et al. | 438/453 |
| 5,300,461 A | * 4/1994 | Ting | 438/460 |
| 5,306,945 A | * 4/1994 | Drummond | 257/620 |
| 5,612,254 A | * 3/1997 | Mu et al. | 257/758 X |
| 5,675,187 A | * 10/1997 | Numata eet al. | 257/758 |
| 5,739,579 A | * 4/1998 | Chiang et al. | 257/635 |
| 5,789,302 A | * 8/1998 | Mitwalky et al. | 438/462 |
| 5,831,330 A | * 11/1998 | Chang | 257/620 |
| 5,834,829 A | * 11/1998 | Dinkel et al. | 257/620 |
| 5,977,639 A | * 11/1999 | Seshan et al. | 257/620 |

* cited by examiner

*Primary Examiner*—Roy Potter
(74) *Attorney, Agent, or Firm*—Blakely, Sokoloff, Taylor & Zafman LLP (57) ABSTRACT

An integrated circuit is provided. The integrated circuit includes a substrate and at least one dielectric layer and a metal layer formed upon the substrate. The at least one dielectric layer includes a terminal dielectric layer. The integrated circuit further includes a planar passivating layer formed upon the terminal dielectric layer.

6 Claims, 7 Drawing Sheets

PLANAR GUARD RING

This application is a continuation of Ser. No. 09/001,397 filed Dec. 31, 1997, now U.S. Pat No. 6,137,155.

BACKGROUND OF THE INVENTION

(1) Field of the Invention

The present invention relates to the field of semiconductor fabrication. More specifically, the present invention relates to integrated circuits that include structures that reduce or prevent damages to the integrated circuit.

(2) Prior Art

Figure 1:
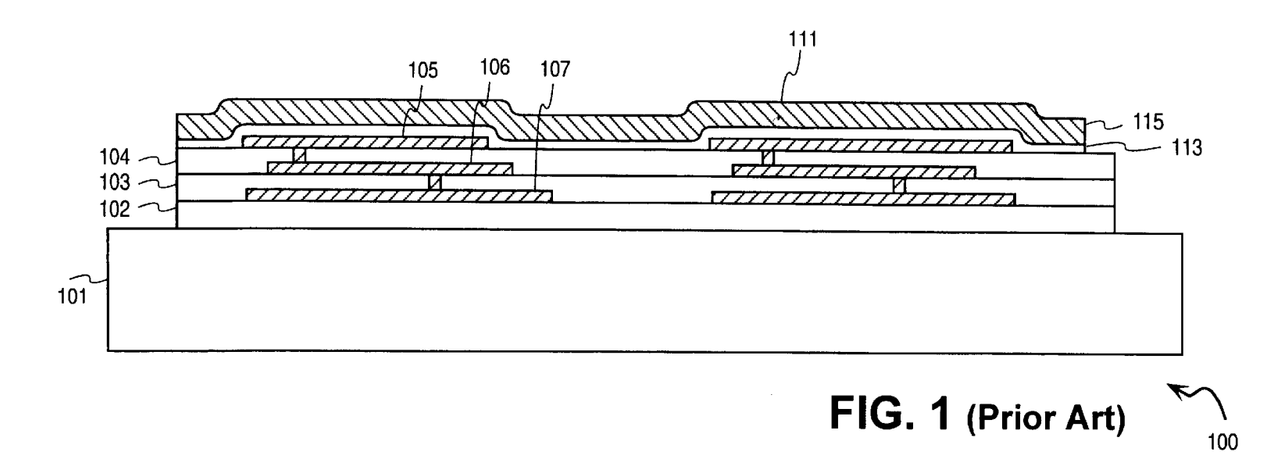
FIG. 1 shows a cross-sectional view through a semiconductor wafer.

FIG. 1 shows a cross-sectional view through a semiconductor wafer 100. Semiconductor wafer 100 includes a silicon substrate 101 that has several dielectric layers 102, 103 and 104 formed thereupon by processes that are well-known in the art. The figure also shows three metal layers that have been deposited, masked, and etched to form metal layers 105, 106, and 107. Metal layers 105–107 overlie device regions to connect the various devices and the subsequently deposited metal layers. A top dielectric layer 111 (passivation layer) is then formed over the terminal metal layer 105 to planarize, insulate the electrical devices and interconnects, to prevent leakage of electrical current through the passivation layer, etc. The passivation layer 111 may include a hard passivation layer 113 typically made of silicon nitride (SiN) and a soft passivation layer typically made of polyamide 115. The polyamide layer covers the Silicon/Nitride layer. The soft passivation layer is deposited by Plasma Enhanced Chemical Vapor Deposition or other typically known passivation layer deposition processes. The layer of silicon nitride is then covered by polyamide or another type of soft passivation layer.

Figure 2A:
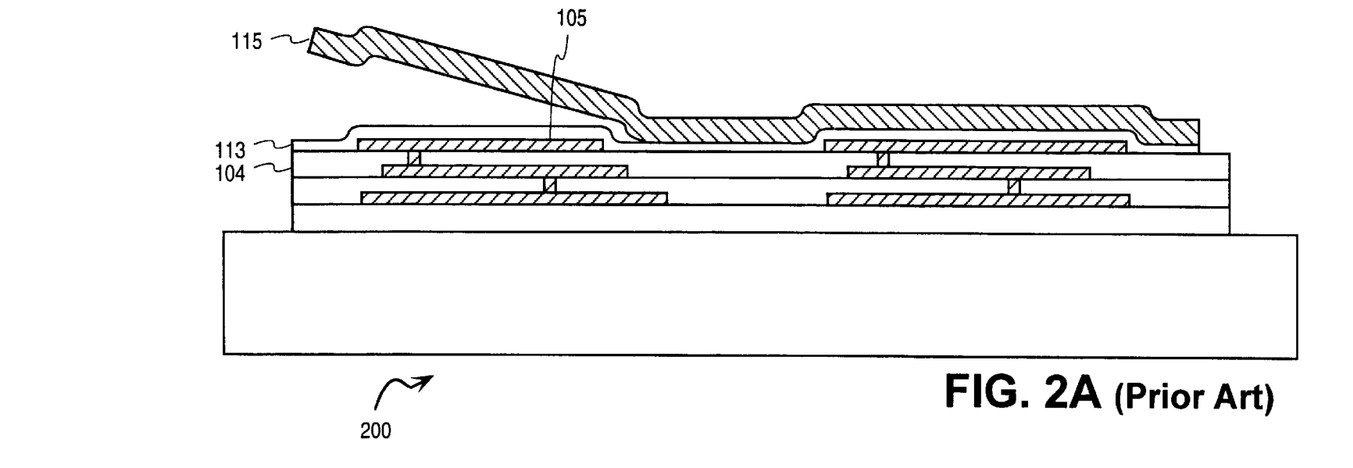
FIG. 2(a) illustrates a cross-sectional view through the semiconductor wafer of FIG. 1 where a soft passivation layer is partly delaminated from a hard passivation layer.

FIG. 2(a) illustrates a cross-section through the semiconductor wafer of FIG. 1 where the soft passivation layer 115 is partly delaminated from the hard passivation layer 113. The delamination typically causes moisture and other impurities to penetrate in the semiconductor wafer. One reason for the passivation layer's delamination is that the die is assembled into a plastic package which is more conducive to propagation of external forces within the package and to the die. The passivation layer may also delaminate when the die and the passivation layer are subjected to pressure pot testing (steam at a pressure greater than atmospheric pressure). One theory explaining this type of delamination is that steam dissolves or weakens the bonds within the passivation layer causing the passivation layer itself to delaminate.

Delamination is more likely to occur at the interface between the passivation layer 111 and the terminal metal layer 105. Delamination typically starts at the edge of the die and propagates towards the center of the die. If the delamination reaches an electrical interconnect, the forces within the die that cause the delamination are applied to the electrical interconnect causing the electrical interconnect to rip apart at weak points thereof.

Figures 2B, 2C:
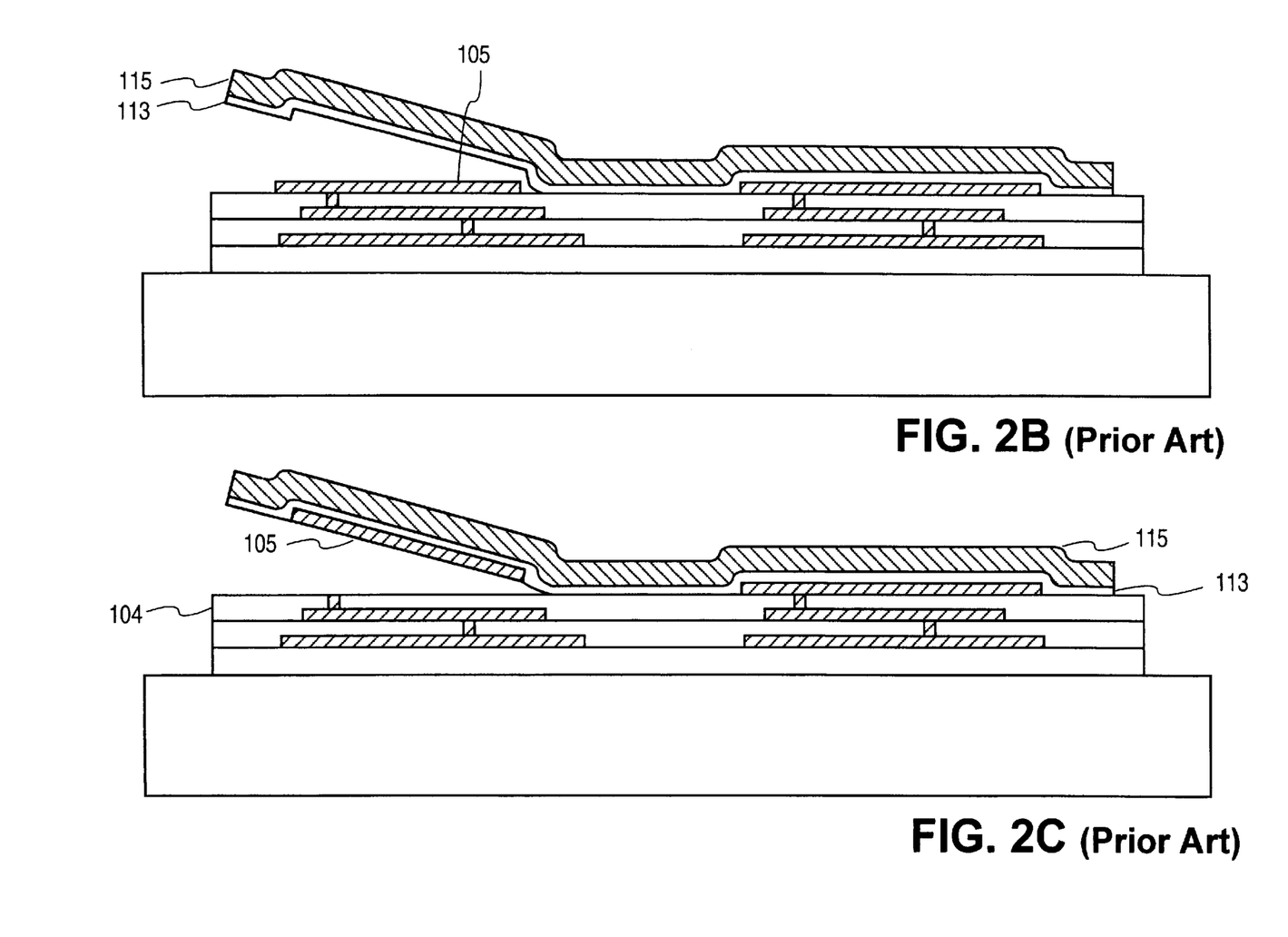
FIG. 2(b) illustrates another cross-sectional view of the semiconductor wafer of FIG. 1 where the soft passivation layer delaminates together with the hard passivation layer.
FIG. 2(c) illustrates a cross sectional view of the semiconductor wafer of FIG. 1 where a terminal metal layer, a soft passivation layer, and a hard passivation layer delaminate.

FIG. 2(b) illustrates another cross section of the semiconductor wafer of FIG. 1 where the polyamide layer 115 delaminates together with the silicon nitride layer 113.

FIG. 2(c) illustrates a cross section of the semiconductor wafer of FIG. 1 where the terminal metal layer 105 and the passivation layer 111, including the silicon nitride layer 113 and the polyamide layer 115, delaminate from dielectric layer 104 as a result of external forces applied to the semiconductor wafer of FIG. 1.

In certain integrated circuits, the TML includes a continuous guard ring that surrounds a die active area of the integrated circuit. The guard ring protects the die active area from damages. Damages, among other things, include invasion by foreign impurities, such as sodium and magnesium, that exist in the environment, and certain mechanical damages, including micro-cracks that may be produced when a wafer is cut into dices. Micro-cracks propagate to die active areas of the chips producing damages thereto.

Figure 3:
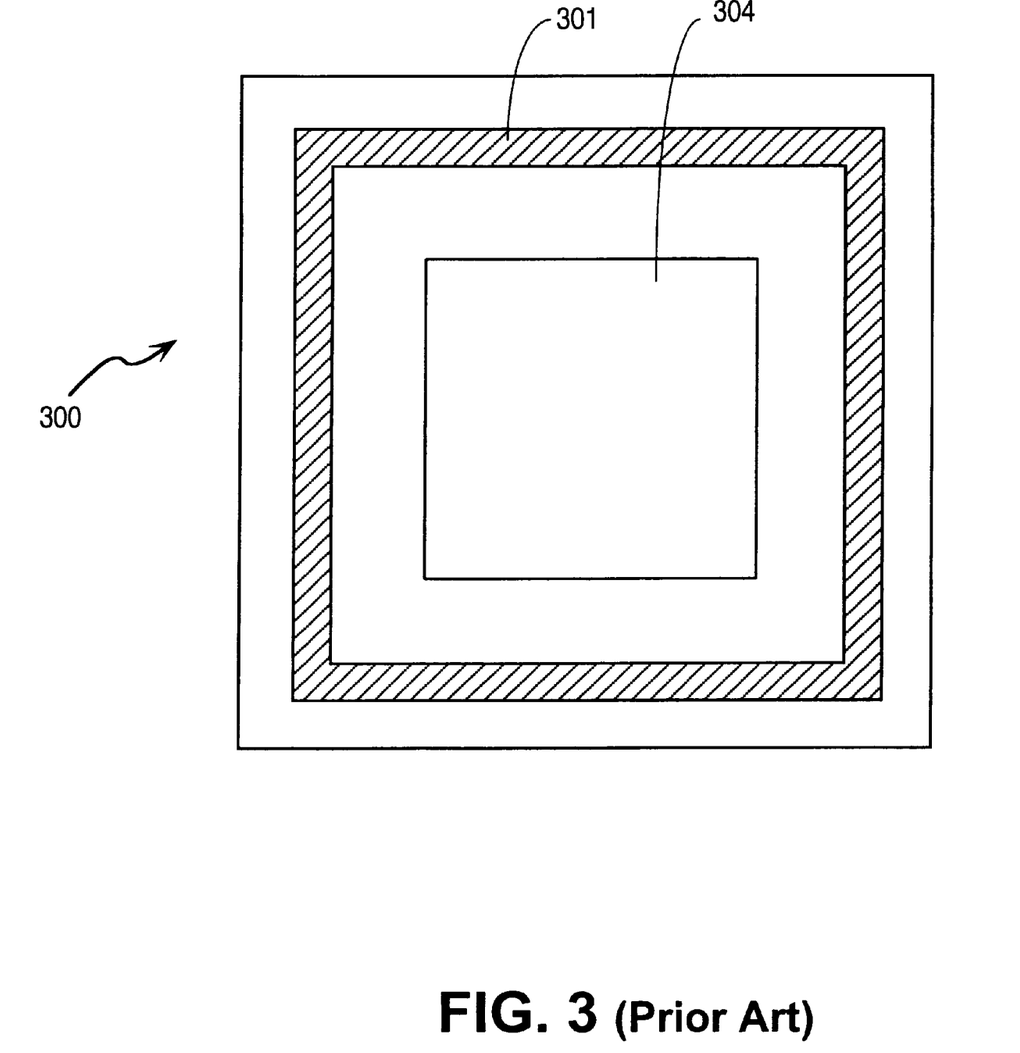
FIG. 3 illustrates a top view of a die with a guard ring.

FIG. 3 illustrates a top view of a die 300 that has a guard ring 304 surrounding the die active area 301 of the integrated circuit. Guard ring 304 protects the die active area from damages.

Present state of the art guard rings are not robust enough to withstand the various forces exerted to the IC. The guard rings may get broken during reliability testing, specifically during temperature cycling to which the integrated circuit is subjected. Shear forces may be exerted to the guard ring during temperature cycling causing damages particularly at and near the corners of the guard ring where these forces have a more destructive effect.

Figure 4:
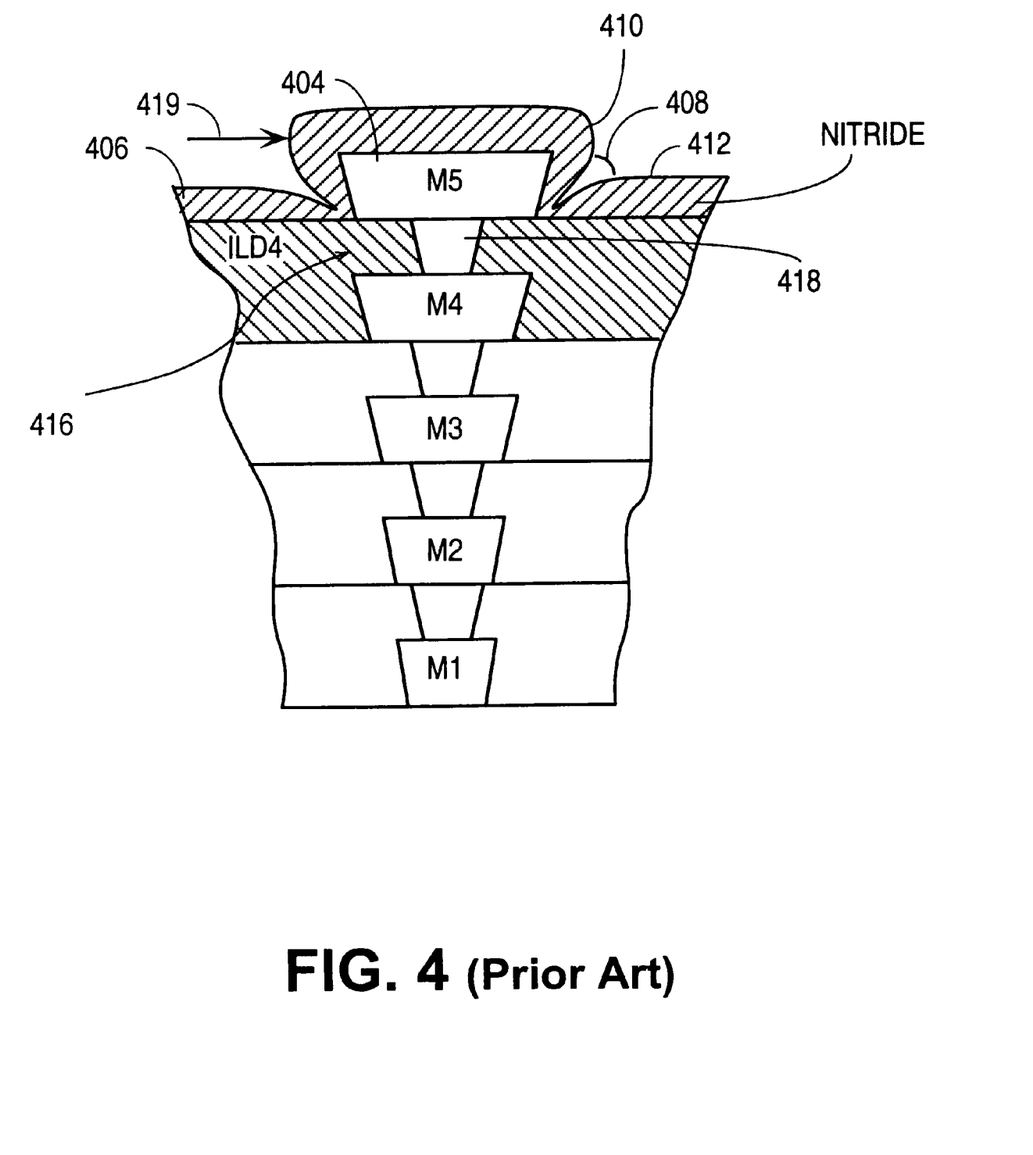
FIG. 4 illustrates a cross-sectional view through a guard wall.

FIG. 4 illustrates a cross-sectional view through a part of a guard wall including guard ring 404 formed in a terminal metal layer (TML) (Metal5). A passivation layer including a conformal nitride layer 406 is formed over the TML including guard ring 404. The nitride layer 406 formed over guard ring 404 has a re-entrant wall 410 that forms a re-entrant angle 408 with a surface 412 of the layer of nitride deposited over the terminal layer of interlayer dielectric (ILD4) 416. The Metal5 guard ring 404 is coupled to a Metal4 guard ring, by way of via 418. During temperature cycling, guard ring 404 tends to move sideways due to the expansion and contraction of the metal of which the guard ring is made and to the shear forces 419 exerted upon the re-entrant wall 410. Moreover, due to forces 419 exerted upon re-entrant wall and the fact that the portion of nitride in the vicinity of the re-entrant angle 408 is thinner, moisture may penetrate into the corner defined by re-entrant angle 408, causing the nitride to crack. This may cause exposure of the Metal5 guard ring 404 to outside agents that may damage the Metal5 guard ring 404.

The fact that the Metal5 guard ring 404 protrudes outside causing the nitride layer to have the profile shown in FIG. 4 (with the re-entrant wall 410 and re-entrant angle 408) causes problems at the interface between the Metal5 and the terminal dielectric layer 416. Moreover, guard ring 404 contributes to instability in the guard wall including guard ring 404 and the other layers of metal as guard ring 406 is subjected to high forces (shear forces). It is desirable to provide a guard wall that is stable and does not contribute to the type of damages caused to the nitride layer and to the guard wall explained above.

SUMMARY OF THE INVENTION

The present invention provides an integrated circuit that includes a substrate and at least one dielectric layer and a metal layer formed upon the substrate. The at least one dielectric layer includes a terminal dielectric layer. The integrated circuit further includes a planar passivating layer formed upon the terminal dielectric layer.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

The present invention provides an integrated circuit. The integrated circuit includes a substrate and at least one dielectric layer and metal layer that are formed upon the substrate. The at least one dielectric layer includes a terminal dielectric layer. Furthermore, the integrated circuit includes a planar passivating layer formed upon the terminal dielectric layer. The planar passivating layer avoids the possibility of damages to the nitride layer caused by re-entrant angles had the integrated circuit included a terminal metal layer with a guard ring protruding outside the terminal dielectric layer. Moreover, the planar passivating layer reduces instability of the integrated circuit otherwise caused by the guard ring formed in the terminal metal layer.

Figure 5:
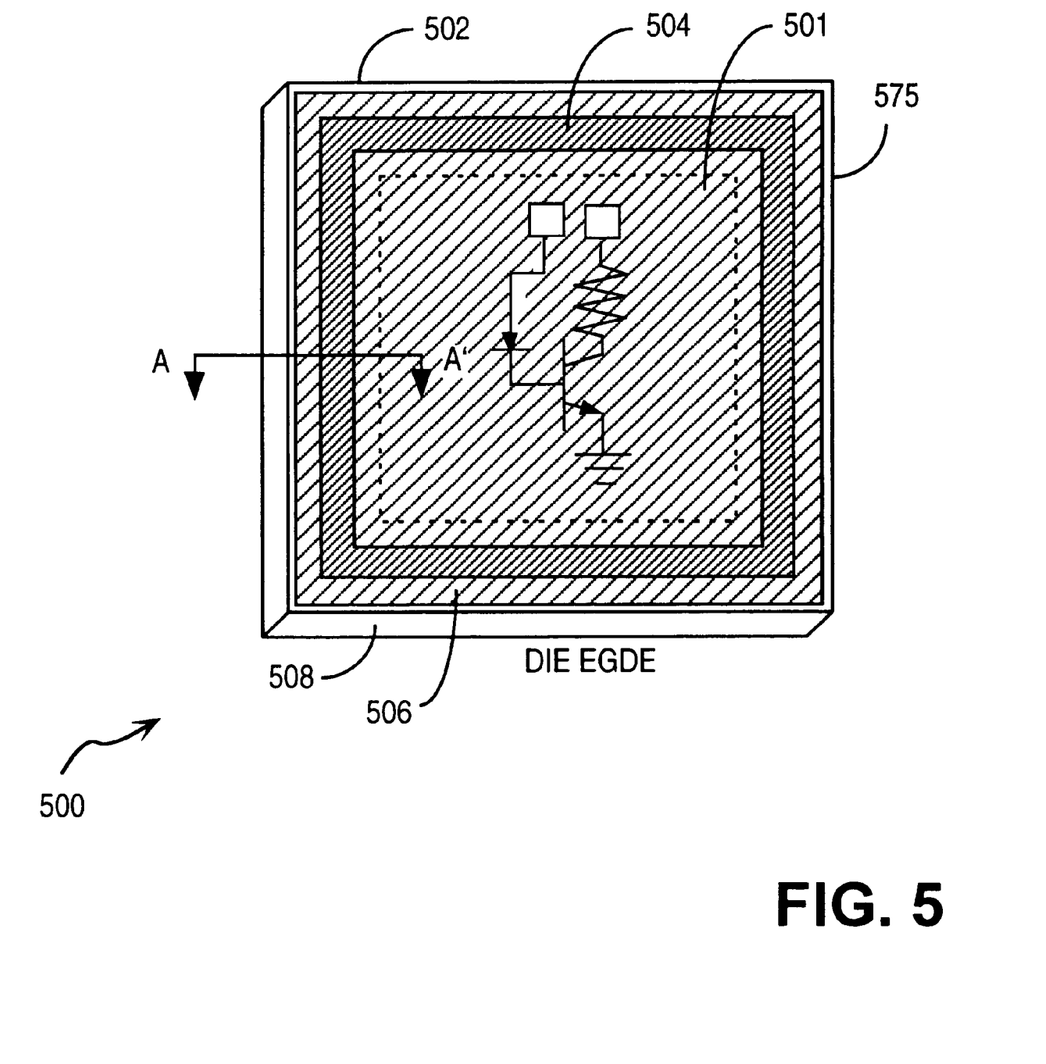
FIG. 5 illustrates a top view of an integrated circuit with a planar passivating layer according to one embodiment of the present invention.

FIG. 5 illustrates a top view of an integrated circuit (die) 500 with a planar passivating layer 506 according to one embodiment of the present invention. The integrated circuit 500 includes a silicon substrate (not shown) upon which dielectric and metal layers, interposed therebetween, are formed. In this integrated circuit, instead of forming a terminal metal layer such as Metal5, by way of example, passivating layer 506 is formed over a terminal dielectric layer 508(ILD 4). The terminal dielectric layer is the most remote layer of dielectric from the silicon substrate (not shown) in a vertical direction perpendicular to the figure. The planar passivating layer 506 includes Nitride in one embodiment according to the present invention.

The terminal dielectric layer 508 has a via 504 formed therein (VIA 4). A die active area 501 is surrounded by the via 504. The die active area 501 is electrically insulated from the via 504. The die active area includes active and passive electrical structures that form electrical circuits.

The passivating layer 506 is formed over both via 504 and terminal dielectric layer 508. Planar passivating layer 506 extends from each side 575 of die 500 to another parallel side of the die 500. A top surface of the terminal dielectric layer 508 is at substantially the same level as a top surface of via 504. Via 504 and the top surface of terminal dielectric layer 508 are polished to enhance the adherence with the planar passivating layer 506. Then the planar passivating layer is deposited onto the top surfaces of the terminal dielectric layer 508 and via 504 by way of a process of Plasma Enhanced Chemical Vapor Deposition (PECVD) which is well known in the art. In this way, the guard wall formed out of the metal layers ($M_1$, $M_2$, $M_3$, and $M_4$) (not shown) and the planar passivating layer 506 terminates with the planar passivating layer instead of a Metal5 guard ring, thereby eliminating problems resulting from the re-entrant angle explained above.

Figure 6:
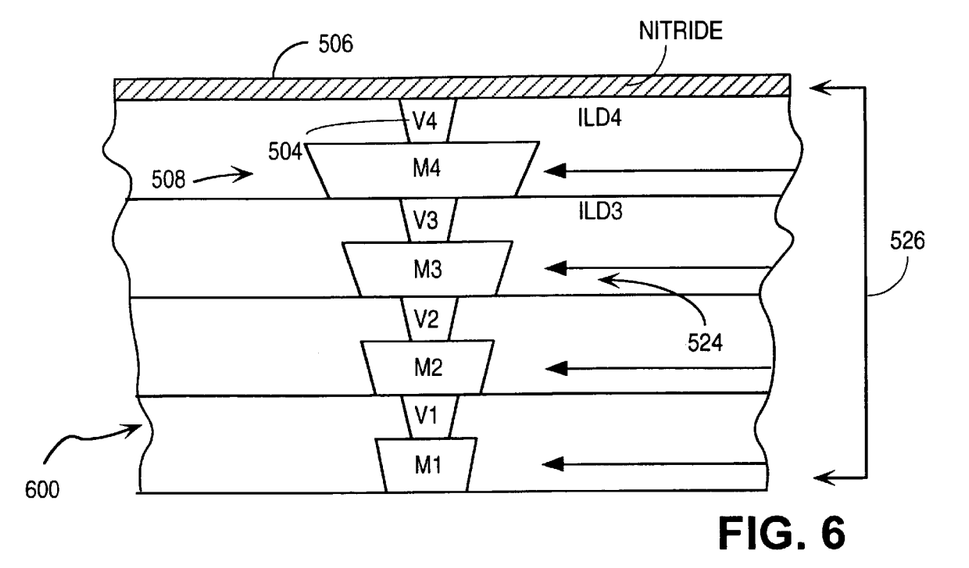
FIG. 6 illustrates a cross-sectional view taken through the integrated circuit with the planar passivating layer according to one embodiment of the present invention.

FIG. 6 illustrates a cross-sectional view of IC 600, taken through line AA' of FIG. 1, with a guard wall with a planar passivating layer 506 according to one embodiment of the present invention. The IC 600 includes metal layers ($M_1$, $M_2$, $M_3$, and $M_4$) interposed between layers of dielectric. A guard wall 526 includes the guard ring portions of $M_1$, $M_2$, $M_3$, and $M_4$, the cross sections of which are shown in the figure, connected by vias 504. The guard wall 526 also includes the planar passivating layer 506 which terminates the guard wall 526. The guard rings formed of each of the metal layers $M_1$, $M_2$, $M_3$, and $M_4$ may be formed by using processes well-known in the art that include photolithography, patterning, etching, etc. A planar passivating layer of nitride 506 is deposited over terminal dielectric layer 508 (ILD 4) and via 504 by way of a PECVD process. Note the difference in widths between the cross sections of the metal layers, $M_1$, $M_2$, $M_3$, and $M_4$ and the width of the passivating layer 602 that extends over the entire die. The thickness of the nitride layer may be approximately 760 nm.

Figure 7:
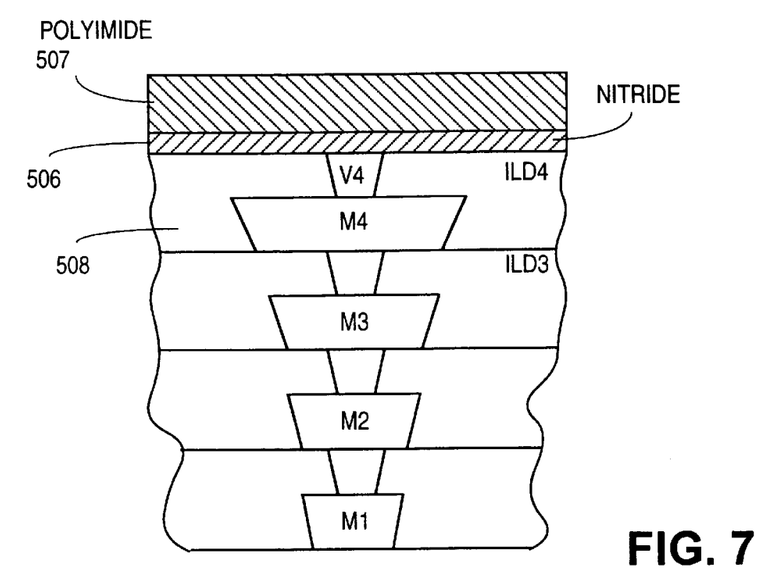
FIG. 7 illustrates another cross-sectional view through an integrated circuit with a planar passivating layer of nitride and a layer of polyamide deposited over the planar passivating layer of nitride.

FIG. 7 illustrates another cross-sectional view of a guard wall with a planar passivating layer of nitride 506 and a layer of polyamide 507 deposited over the layer of nitride.

Figure 8:
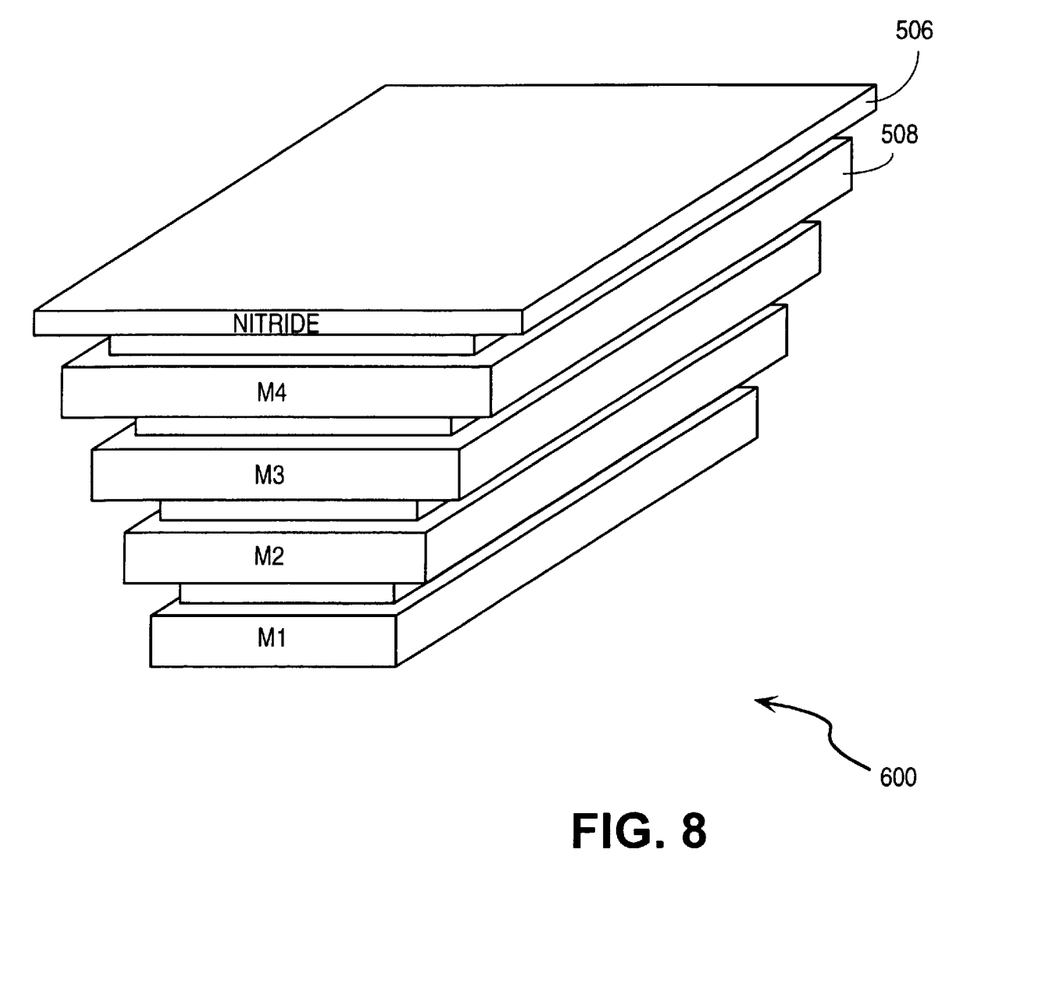
FIG. 8 illustrates a partial top and lateral view of an IC 600 with a planar passivating layer formed over terminal dielectric layer 508.

FIG. 8 illustrates a partial top and lateral view of an IC 600 with a planar passivating layer 506 formed over terminal dielectric layer 508.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A method comprising:
   providing an integrated circuit substrate including a plurality of devices disposed in an active area of the substrate and a plurality of layers of interconnects, a portion of the devices coupled to one another through a terminal interconnect;
   introducing a guard wall over the plurality of layers of interconnects and surrounding a periphery of the active area and coupled to the terminal interconnect; and
   introducing a passivation material over the guard wall, the passivating material comprising a plurality of passivating layers.

2. The method of claim 1, wherein introducing a passivation material comprises:

introducing a first passivating layer;

planarizing the first passivating layer; and introducing a second passivating layer.

3. The method of claim 1, further comprising:

prior to introducing the passivation material, introducing a terminal dielectric layer over the guard wall.

4. The method of claim 1, wherein introducing the guard wall comprises introducing a plurality of guard wall portions and an interconnect from each of the plurality of layers is coupled to a guard wall portion.

5. The method of claim 4, wherein a guard wall portion has a dimension and the dimension of first a guard wall portion is less than a dimension of a second guard wall portion.

6. The method of claim 5, wherein, from the substrate, the dimension of each of a successive guard wall portion is greater than a previous guard wall portion.

* * * * *